US012693317B2

(12) United States Patent
Verma

(10) Patent No.: US 12,693,317 B2
(45) Date of Patent: Jul. 28, 2026

(54) DETECTING AIRCRAFT 28V DISCRETE INPUTS

(71) Applicant: Hamilton Sundstrand Corporation, Charlotte, NC (US)

(72) Inventor: Richa Verma, Bangalore (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 182 days.

(21) Appl. No.: 18/658,761

(22) Filed: May 8, 2024

(65) Prior Publication Data

US 2025/0044327 A1 Feb. 6, 2025

(30) Foreign Application Priority Data

Aug. 4, 2023 (IN) .............................. 202341052618

(51) Int. Cl.
*G01R 19/165* (2006.01)
*H02H 1/00* (2006.01)
*H02H 7/20* (2006.01)

(52) U.S. Cl.
CPC . *G01R 19/16504* (2013.01); *G01R 19/16528* (2013.01); *H02H 1/0007* (2013.01); *H02H 7/20* (2013.01)

(58) Field of Classification Search
CPC ........ B64D 2045/0085; B64D 2221/00; G01R 19/16504; G01R 19/16528; G01R 31/008; H02H 1/0007; H02H 7/20

USPC .......................................................... 361/42
See application file for complete search history.

(56) References Cited

U.S. PATENT DOCUMENTS

| | | | |
|---|---|---|---|
| 3,737,672 A | 6/1973 | Hill et al. | |
| 8,674,681 B2 | 3/2014 | Nanayakkara | |
| 9,450,507 B2 | 9/2016 | Pwu et al. | |
| 2018/0323604 A1* | 11/2018 | Hoegberg | H02H 9/04 |
| 2020/0014294 A1* | 1/2020 | Song | H02M 3/158 |
| 2021/0167591 A1* | 6/2021 | Pennam | G01R 31/008 |

FOREIGN PATENT DOCUMENTS

EP          3828561 A1     6/2021

OTHER PUBLICATIONS

European Search Report dated Feb. 5, 2025 in connection with European Patent Application No. 24191727.7, 8 pages.

* cited by examiner

*Primary Examiner* — Kevin J Comber

(57) ABSTRACT

A circuit for detecting discrete inputs includes a first line replaceable unit (LRU). A second LRU includes an LRU circuit that includes a power source, a diode set coupled to the power source, a resistor R3 connecting from a node Vc between the diode set and the first LRU to ground, and a logic detection and processing circuit. The logic detection and processing circuit is operably connected to the diode set, and is configured to detect a state of the first LRU based on a detected voltage. The detected voltage is either open, or 28-Volts.

20 Claims, 3 Drawing Sheets

200

202

Start

204

Operating a detection circuit confiugred to detect a discrete 28V input

206

Receiving the discrete input

208

Detecting the discrete input over a path that maintains a constant voltage drop to enchance an operating voltage of the detection circuit

210

Processing the discrete input

212

End

300

DETECTING AIRCRAFT 28V DISCRETE INPUTS

BACKGROUND

1. Field

The present disclosure relates generally to circuits, and more particularly to circuits and methods for detecting discrete inputs such as for use on an aircraft.

2. Description of Related Art

Aircraft are equipped with a number of detection circuits that can provide various types of information. This information can indicate whether a device is connected or disconnected. In addition, the information can also indicate whether the device is in an operational state or a failed state. The detection circuits are configured to function over a limited operating range. There may be a need to increase the operating range and reliability of the detection circuits.

Typical generators aboard aircraft can produce power using a variable input that can impact the power that it provides to the connected circuits and systems. The generator can be a permanent magnet generator (PMG) that is driven by the engine. A logic detection and processing can be powered over a limited operating range of 18V to 32.2V. During a ramped down phase of the generator, the abnormal steady state power that is derived from the generator can be as low as 13.2V which is below the typical operating lower limit of 18V. On the other hand, when the aircraft is grounded an external power source can be connected to an external power source such as an AC ground cart. During such an event the source voltage can be increased beyond the normal operating max of 34V (e.g. to 37.4V) due to an overvoltage condition responsive to being connected to the external power AC source.

A generator control unit (GCU) and a bus power control unit (BPCU) monitor and sends the status of each input output (I/O) to a microcontroller for all the GROUND/OPEN discrete inputs and 28V/OPEN discrete inputs. Other examples of 28V/OPEN inputs on an aircraft include sustained parallel source protection input, fire software input, generator control switch on input, power supply okay input, and the like.

The conventional techniques have been considered satisfactory for their intended purpose. However, there is an ever present need for improved systems and methods for detecting discrete inputs, especially as used aboard aircraft. This disclosure provides a solution for this need.

SUMMARY

A circuit for detecting discrete 28V aircraft inputs includes a first line replaceable unit (LRU). A second LRU includes an LRU circuit that includes a power source, a diode set coupled to the power source, a resistor R3 connecting from ground to a node Vc that is between the diode set and the first LRU, and a logic detection and processing circuit. The logic detection and processing circuit is operably connected to the diode set, and is configured to detect a state of the first LRU based on a detected voltage. The detected voltage is either open, or 28-Volts.

The diode set can include at least a first Zener diode and a second Zener diode connected in series with one another. The first Zener diode and the second Zener diode can be connected in series between the power source and the logic detection and processing circuit. The first Zener diode can be oriented to inhibit current below a Zener voltage of the first Zener diode from the power source to the logic detection and processing circuit. The second Zener diode can be oriented to inhibit current below a Zener voltage of the second Zener diode from the power source to the logic detection and processing circuit.

The at least one diode of the diode set can be a protection diode. The protection diode can be reverse biased during a negative overcurrent event. The second LRU can include a diode configured to provide forward bias protection to the logic detection and processing circuit.

The power source can include a generator. The power source can include an external power source external from the second LRU. The first LRU can be selectably connected to the logic detection and processing circuit using a switch.

A method of operating a logic detection and processing circuit includes operating the logic detection and processing circuit configured to detect a state of a line replaceable unit (LRU), providing power to a circuit, and receiving a discrete input. The method includes detecting, by a logic detection and protection circuit, the discrete input over a path that maintains a constant voltage, wherein the discrete input is either open or 28-Volts. The method includes processing, including logic detection and processing logic, the discrete input.

The method can include switching the circuit from a first mode to a second mode. The first mode can be powered by a generator. The method can include maintaining the constant voltage drop over a range of operation of the generator. The second mode can be powered by an external power source. The method can include maintaining the constant voltage drop when operating in the second mode. The method can include protecting the circuit during a negative over-current event. The method can include protecting the circuit during a positive over-current event.

Determining the discrete input is open can include detecting, using the logic detection and protection circuit, voltage at a node Vb that is below a predetermined threshold, wherein voltage at the node Vb equals leakage current multiplied by resistance of a resistor R2 that connects between the node Vb and ground, wherein leakage current includes a sum of leakage currents in the logic detection and protection circuit and at least two Zener diodes Z1 and Z2 in the path.

Providing power to a circuit can include providing power from power source connected to the path at a node Va, wherein determining the discrete input is at 28-Volts includes a first case where when a diode D1 is forward biased, and a second case where the diode D1 is reverse biased, wherein the diode D1 is connected between the node Va where the power source connects to the path and a node Vc, wherein a resistor R3 connects the path to ground. The diode D1 is to protect the unit from positive transients/lightning hitting the LRU 102. And diode D3 will protect the unit from the negative transients/lightning.

In the first case, V1<voltage of the power source, voltage at the nodes Vc, Va and Vb can be governed by:

$$Vc = (V1 * R_{R3})/(R_{R3} + IMP),$$

$$Va = Vc + Vf\_D1, \text{ and}$$

$$Vb = Va - Vf\_D3 - VZ1 - VZ2,$$

wherein V1 is voltage received from an aircraft discrete input of 28V from the LRU, $R_{R3}$ is resistance of the resistor R3, IMP is input filter impedances of an input filter connecting the LRU to the path, Vf_D1 is forward voltage of the diode D1, Vf_D3 is forward voltage of a diode D3 in the path in series between the node Va and the at least two Zener diodes Z1 and Z2, VZ1 is Zener voltage across the Zener diode Z1, VZ2 is Zener voltage across the Zener diode Z2, wherein the diode D3 is oriented to inhibit flow in the path in a direction from the at least two Zener diodes Z1 and Z2 to the node Va, wherein * indicates multiplication, and wherein/indicates division.

In the second case, V1>voltage of the power source, voltage at the nodes Vc, Va and Vb can be governed by:

$$Vb = \{(VDC\_SOURCE - Vf\_D3 - VZ1 - VZ2) * R_{R2}\}/(R_{R2} + R_{R1})$$

wherein VDC_SOURCE is voltage of the power source, $R_{R2}$ is resistance of the resistor R2, and $R_{R1}$ is resistance of a resistor R1, and wherein the resistor R1 connects between the power source and the node Va.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
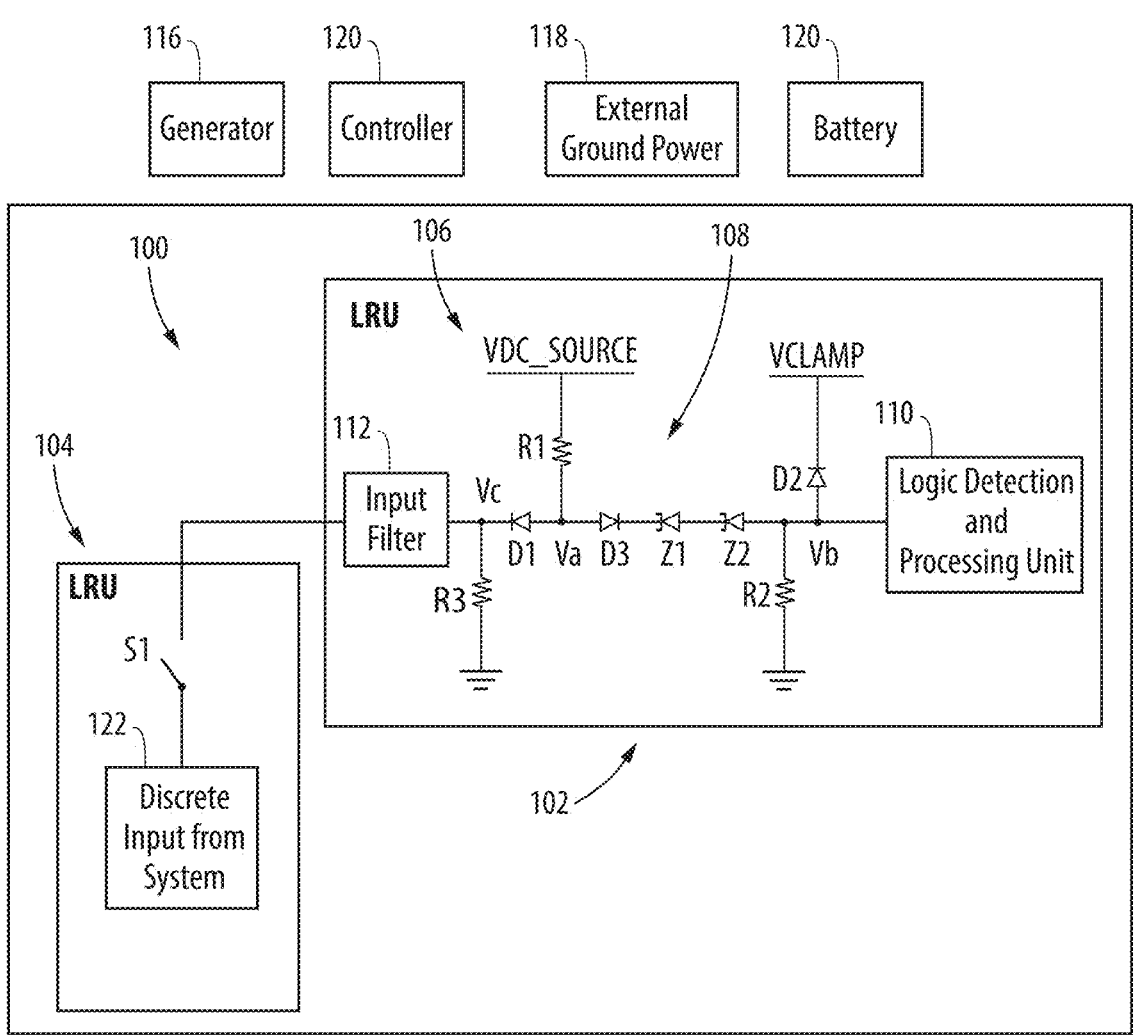
FIG. 1 is a schematic view of an embodiment of a system constructed in accordance with the present disclosure, showing a circuit for detecting an aircraft discrete 28V/open input in accordance with one or more aspects of the disclosure.

Reference will now be made to the drawings wherein like reference numerals identify similar structural features or aspects of the subject disclosure. For purposes of explanation and illustration, and not limitation, a partial view of an embodiment of a circuit in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to detect whether a discrete input is at 28V or is instead open, e.g. for use in digital systems onboard aircraft.

Figure 3:
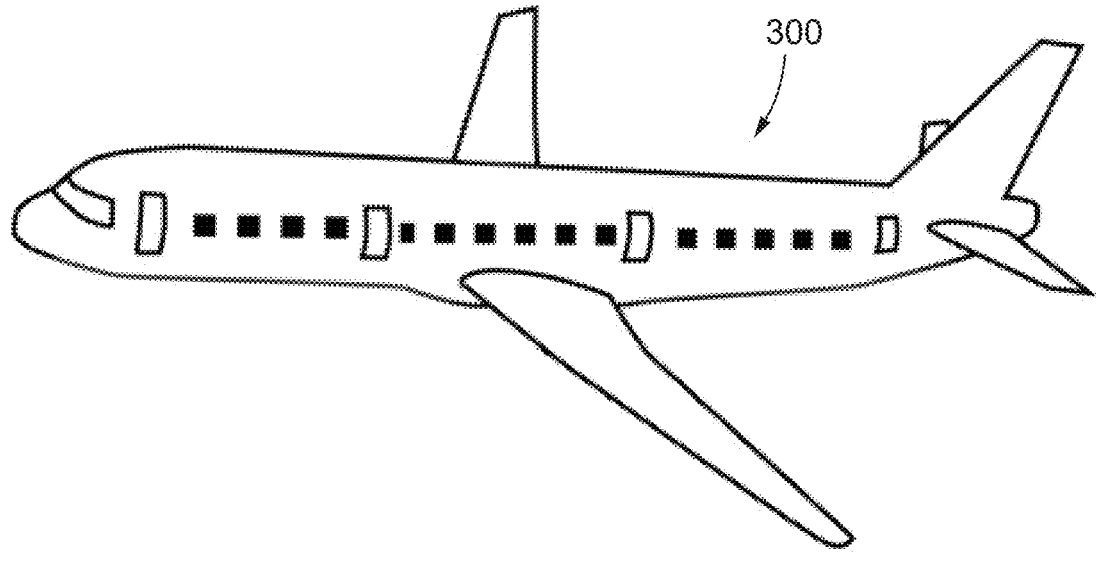
FIG. 3 is a schematic view of an aircraft that includes the circuit of FIG. 1 in accordance with one or more aspects of the disclosure.

The circuit 100 for detecting discrete inputs includes a first line replaceable unit (LRU) 104. A second LRU 102 includes an LRU circuit with a power source 106, i.e. a connection for connecting the LRU 102 to be supplied from a source external to the LRU 102. The external source can include a generator 116, an external ground power source 118, or battery source 120. The systems 100, 116, 120, and 120 as described below can be aboard an aircraft 200 as shown in FIG. 3, and the external ground power 118 can be connected to the aircraft 200.

A discrete 28V input can be obtained by a line replacement unit (LRU) 102 including a sensing circuit and provided to a logic detection and processing circuit of an LRU 104 including a discrete input circuit 122. The LRU 102 receives power from a VDC_SOURCE. The VDC_SOURCE can be derived from a generator 116, an external ground power source 108, or battery source 120.

In one or more embodiments, the LRU 104 can include a discrete 28 v input from an aircraft. In one or more embodiments, the discrete 28V inputs can be either open or 28V state. The LRU 104 also includes a switch that can be controlled to provide the discrete 28V input signal to LRU 102.

The LRU 102 includes a number of components and it should be understood that it is not limited by that disclosed in FIG. 1. The LRU 102 includes a logic detection and processing circuit 110, input filter 112, voltage input, and a number of passive circuit elements.

The LRU 102 can include an input filter 112 to filter out noise from the input signal from the LRU 102. It should be understood the input filter 112 can include a number of passive components such as resistors, capacitors, and inductors to filter the input, or the input filter 112 can include active switching components that can be used to filter the input signal. In another embodiment, the input filter 112 can be coupled to a single LRU to filter the input signal.

As shown, the logic detection and processing circuit 110 is coupled to the node Vb and is configured to detect the discrete input by changes in the voltage detected and the Vb node. The voltage at the node Vb is dependent on the resistor R1, connecting between the source 106 and the node Va, the diode set 108, and the resistor R2, connecting from the node Vb to ground in case the discrete 28V input received from LRU 104 is more than the source 106. In case the discrete 28V input received from LRU 104 is less than the source 106, voltage at the node Vb is dependent on the voltage at the node Vc, forward voltage of diode D1, and the drops of the diode set 108. The selection of the resistance values for resistors R1 and R2 should be sized to meet the stress and logic level requirements of the logic detection and processing circuit 110. In addition, the higher the value for the resistor R2, the greater the leakage current in the open state.

The LRU circuit includes a diode set 108 coupled to the power source 106 and a logic detection and processing circuit 110. The logic detection and processing circuit 110 is operably connected to the diode set 108 to detect a state of the LRU 104 based on a detected voltage. The detected voltage is either open (e.g. 0-Volts detected), or 28-Volts such as for aircraft system inputs.

The diode set 108 includes a first Zener diode Z1 and a second Zener diode Z2 connected in series with one another. Those skilled in the art will readily appreciate that additional Zener diodes can be connected in series with the first and second Zener diodes Z1 and Z2 as needed for a given application. The first and second Zener diodes Z1 and Z2 are connected in series between the power source 106 and the logic detection and processing circuit 110. Both Zener diodes Z1, Z2 are oriented to inhibit current below their respective Zener voltages from flowing from the power source 106 to the logic detection and processing circuit 110. The first and second Zener diodes Z1, Z2 can each have the same or different Zener voltage depending on how much constant drop needs to be maintained. Voltage drop across the first and second Zener diodes Z1 and Z2 remains constant during operation. Having two Zener diodes in series will help to reduce the stress on both Zener diodes, when compared to having one single Zener diode.

The diode set includes a protection diode D1. The protection diode D1 is reverse biased during a positive lightning strike. The anode of the diode D1 is coupled to the node Va and the cathode of the diode D1 is coupled to the input filter 112. The diode D1 can be used for protection. The diode D1 can be a Schottky diode and have a low forward voltage drop and a very fast switching action. The LRU 102 can also include a VCLAMP that is coupled to the node Vb through a diode D2, where the anode of the diode D2 is connected to the node Vb and the cathode of the diode D2 is connected to the VCLAMP to provide clamping voltage for the diode set 108. In case the voltage at node Vb is more than permitted for the logic detection and processing circuit 110, the Node Vb will be clamped to VCLAMP+Vf_D2, where Vf_D2 is the voltage drop of the diode D2. VCLAMP voltage is internal to the LRU 102, and can be chosen similar to the supply voltage required for logic detection and processing circuit 110 interface.

In one or more embodiments, the diode set 108 can also include a diode D3. The anode of the diode is connected to the node Va and the cathode is connected to the cathode of the Zener diode Z1. The diode D3 provides forward bias protection to protect the logic detection and processing circuit 110 and also protects negative lightning transients for the remaining circuit. The anode of the Zener diode Z2 is connected to the node Vb and the cathode of the Zener diode Z2 is connected to anode of the Zener diode Z1.

The input filter 112 is selectively coupled to the LRU 104 using a switch S1. The switch S1 can be closed and opened by a controller 120 which can detect the state of the discrete input circuit 122 of the LRU 104. The logic detection and processing circuit 110 is configured, e.g. with analog and/or digital logic and/or machine readable instructions, to perform methods as disclosed herein.

A resistor R3 connects from the node Vc to ground. The node Vc is in series between the diode set 108 and the first LRU 104, and more specifically between the diode D1 and the input filter 112. The resistance of the resistor R3 can be selected such as to meet the sink current requirements of the LRU circuit of the LRU 102 when the input is in a 28V input state received from the LRU 104.

Figure 2:
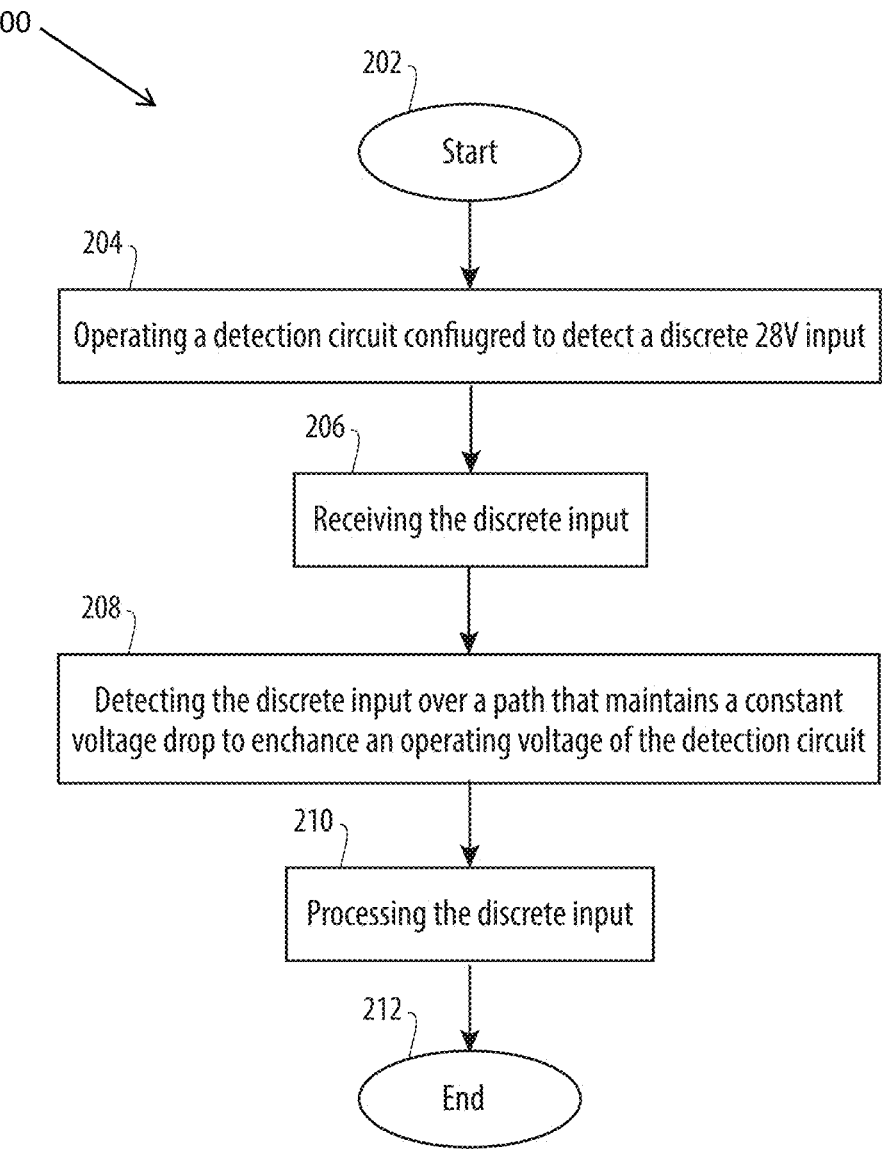
FIG. 2 is a flow diagram of a method for operating the circuit of FIG. 1 to detect 28V discrete input in accordance with one or more aspects of the disclosure.

With reference now to FIG. 2 and continued reference to FIG. 1 for reference characters mentioned but not shown in FIG. 2, a method of operating a logic detection and processing circuit 110 is described. FIG. 2 depicts a method for operating the circuit for detecting discrete inputs 110 in accordance with one or more embodiments of the disclosure. The method begins at block 202 and proceeds to block 204 which provides for operating a detection circuit for detecting the discrete input. In one or more embodiments, the power source 106 of the circuit can be switched from the generator power 116 to the external power 118 or battery power 120. In the event an overvoltage condition is detected, issues may arise when detecting discrete input 28V status.

Block 206 receives the discrete input, which can be 28V or open. The discrete input can be coupled to the logic detection and processing circuit 110. For example, a generator control signal (GCS) is a discrete input signal, which is under the pilot's control which will be used to reset the generator control unit (GCU) LRU. In the conventional method, a pilot fails to reset the GCU LRU when required during a low power or high power conditions occurs outside of the limited operating range.

Block 208 detects the discrete input over a path, e.g. the electrical path through the diode set 108, that maintains a constant voltage drop to enhance the operating voltage of the detection circuit. The path includes Zener diodes Z1, Z2 that have a constant voltage drop over an operating range of the circuit. For example, when the voltage supply provided by a generator changes, the logic detection and processing circuit 110 is able to detect the state of the connected LRU 104. If the voltage is increased responsive to being connected to an external power source, the logic detection and processing circuit 110 is still able to detect the state. Block 210 processes the discrete input. The logic detection and processing circuit 110 can determine the state provided by the discrete input. The method 200 ends at block 212. The method includes protecting the circuit during a positive and negative lightning transients as per RTCA (Radio Technical Commission for Aeronautics) DO-160, e.g. with the diodes D1 and D3.

Determining the discrete input of the LRU 104 is open, i.e. switch S1 is open, includes detecting, using the logic detection and protection circuit 110, voltage at a node Vb that is below a predetermined threshold, wherein voltage at the node Vb equals leakage current multiplied by resistance of a resistor R2 that connects between the node Vb and ground, wherein leakage current includes a sum of leakage currents in the logic detection and protection circuit and at least two Zener diodes Z1 and Z2 in the path. OPEN state detection is as follows. During an open state condition of the LRU 104, e.g. the aircraft input, most of the current flows through the source 106, the resistor R1, diode D1 and resistor R3. Hence the Zener diodes Z1 and Z2 will not be conducting, since only some amount of current will be flowing through the didoes D3, Z1 and Z2.

Providing power to a circuit includes providing power from the power source 106 connected to the path at a node Va. Determining the discrete input is at 28-Volts includes a first case where when a diode D1 is forward biased, and a second case where the diode D1 is reverse biased, wherein the diode D1 is connected between the node Va where the power source 106 connects to the path and a node Vc, wherein a resistor R3 connects the path to ground. There are have two scenarios when Switch S1 is closed. The aircraft discrete input at the system (S1 closed) will be referred as V1. In this case, e.g. Case A: V1<VDC_SOURCE, wherein VDC_SOURCE is the voltage supplied from the source 106. When this condition exists the diode D1 will be forward biased. In the first case, voltage at the nodes Vc, Va and Vb are governed by:

$$Vc = (V1 * R_{R3})/(R_{R3} + IMP),$$

$$Va = Vc + \mathrm{Vf\_D1}, \text{ and}$$

$$Vb = Va - \mathrm{Vf\_D3} - VZ1 - VZ2,$$

wherein V1 is voltage received from aircraft discrete input 28V from LRU 104, $R_{R3}$ is resistance of the resistor R3, IMP is input filter impedances of an input filter connecting the LRU to the path, Vf_D1 is forward voltage of the diode D1, Vf_D3 is forward voltage of a diode D3 in the path in series between the node Va and the at least two Zener diodes Z1 and Z2, VZ1 is Zener voltage across the Zener diode Z1, VZ2 is Zener voltage across the Zener diode Z2, wherein the diode D3 is oriented to inhibit flow in the path in a direction from the at least two Zener diodes Z1 and Z2 to the node Va, wherein * indicates multiplication, and wherein/indicates division. In case Vb exceeds the absolute maximum of the logic detection device, we have a diode D2 connected to Vclamp which ensures the Voltage at Vb doesn't damage the logic devices.

In the second case, Case B, V1>voltage of the power source. In this case, the voltage at the nodes Vc, Va and Vb are governed by:

$$Vb = \{(VDC\_SOURCE - Vf\_D3 - VZ1 - VZ2) * R_{R2}\}/(R_{R2} + R_{R1})$$

wherein VDC_SOURCE is voltage of the power source, $R_{R2}$ is resistance of the resistor R2, and $R_{R1}$ is resistance of a resistor R1, and wherein the resistor R1 connects between the power source and the node Va. In case Vb exceeds the absolute maximum of the logic detection device 110, there is a diode D2 connected to VCLAMP which ensures the voltage at Vb doesn't damage the logic devices.

Systems and methods as disclosed herein provide potential benefits including the following. Operating range can be enhanced to detect the aircraft power even if the source of the power ramps up or down during abnormal conditions. The circuit is capable of detecting the aircraft 28V state in both conditions (when the aircraft input is higher than VDC_SOURCE & when the aircraft input is lower than VDC_SOURCE). Systems and methods as disclosed herein can efficiently estimate the working voltage range of the circuit due to the voltage drop across the Zener constant. Having two or more Zener diodes Z1, Z2 allows for the intended drop out voltage required to be shared by the Zener diodes, so that a single Zener diode is not stressed for its rated value. Systems and methods as disclosed herein can provide increased discrete input detection range, and can provide for less costly components and simplified detection techniques for detecting the 28V/Open aircraft system inputs.

The methods and systems of the present disclosure, as described above and shown in the drawings, provide for detecting whether a discrete input is at 28V or is instead open, e.g. for use in digital systems onboard aircraft. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A circuit for detecting discrete inputs, the circuit comprising:
  a first line replaceable unit (LRU); and
  a second LRU including an LRU circuit, the LRU circuit including:
    a power source;
    a diode set coupled to the power source;
    a first resistor connecting from a node to ground, wherein the node is in series between the diode set and the first LRU; and
    a logic detection and processing circuit operably connected to the diode set and configured to detect a state of the first LRU based on a detected voltage, wherein the detected voltage is either open or 28-Volts; and
  wherein the diode set includes at least a first Zener diode and a second Zener diode connected in series with one another and connected in series between the power source and the logic detection and processing circuit, the second Zener diode having an anode connected to the logic detection and processing circuit.

2. The circuit of claim 1, wherein:
  the first Zener diode is oriented to inhibit current below a Zener voltage of the first Zener diode from the power source to the logic detection and processing circuit; and
  the second Zener diode is oriented to inhibit current below a Zener voltage of the second Zener diode from the power source to the logic detection and processing circuit.

3. The circuit of claim 2, wherein:
  at least one diode of the diode set is a protection diode; and
  the protection diode is reverse-biased during a negative over-current event.

4. The circuit of claim 1, wherein the power source includes a generator.

5. The circuit of claim 1, wherein the power source includes an external power source external from the second LRU.

6. The circuit of claim 1, wherein the first LRU is selectably connected to the logic detection and processing circuit using a switch.

7. The circuit of claim 1, wherein the second LRU further includes a diode configured to provide forward-bias protection to the logic detection and processing circuit.

8. The circuit of claim 1, wherein a cathode of the first Zener diode is connected to the diode set.

9. A method comprising:
  detecting a state of a line replaceable unit (LRU) using a logic detection and processing circuit;
  providing power to a circuit;
  receiving a discrete input;
  detecting, by the logic detection and processing circuit, the discrete input over a path that maintains a constant voltage, wherein the discrete input is either open or 28-Volts; and
  processing, by the logic detection and processing circuit, the discrete input;
  wherein processing the discrete input comprises determining that the discrete input is open by detecting, using the logic detection and processing circuit, voltage that is below a specified threshold at a first node, the voltage at the first node based on leakage current multiplied by a resistance of a first resistor that connects between the first node and ground, the leakage current including a sum of leakage currents in the logic detection and processing circuit and at least two Zener diodes in the path, one of the at least two Zener diodes having an anode connected to the logic detection and processing circuit at the first node.

10. The method of claim 9, further comprising switching the circuit from a first mode to a second mode.

11. The method of claim 10, wherein the first mode is powered by a generator.

12. The method of claim 11, further comprising maintaining a constant voltage drop over a range of operation of the generator.

13. The method of claim 10, wherein the second mode is powered by a power source external from the LRU.

14. The method of claim 13, further comprising maintaining a constant voltage drop when operating in the second mode.

15. The method of claim 9, further comprising protecting the circuit during a negative over-current event.

16. The method of claim 9, further comprising protecting the circuit during a positive over-current event.

17. The method of claim 9, wherein:

providing the power to the circuit includes providing power from a power source connected to the path at a second node;

processing the discrete input comprises determining that the discrete input is at 28-Volts during a first case where a first diode is forward-biased and a second case where the first diode is reverse-biased;

the first diode is connected between the second node where the power source connects to the path and a third node; and a second resistor connects the path to ground at the third node.

18. The method of claim 17, wherein, in the first case, voltages at the first, second, and third nodes are defined as:

$$Vc = (V1 * R_{R3})/(R_{R3} + IMP),$$

$$Va = Vc + Vf\_D1, \text{ and}$$

$$Vb = Va - Vf\_D3 - VZ1 - VZ2,$$

wherein:

Vc is the voltage at the third node;

Va is the voltage at the second node;

Vb is the voltage at the first node;

V1 is the discrete input at 28V;

$R_{R3}$ is a resistance of the second resistor;

IMP is an input filter impedance of an input filter connecting the LRU to the path;

Vf_D1 is a forward voltage of the first diode;

Vf_D3 is a forward voltage of a second diode in the path in series between the second node and the at least two Zener diodes;

VZ1 is a Zener voltage across one of the Zener diodes;

VZ2 is a Zener voltage across another of the Zener diodes;

the second diode is oriented to inhibit flow in the path in a direction from the at least two Zener diodes to the second node;

* indicates multiplication; and

/ indicates division.

19. The method of claim 18, wherein, in the second case, the voltage at the first node is defined as:

$$Vb = \{(VDC\_SOURCE - Vf\_D3 - VZ1 - VZ2) * R_{R2}\}/(R_{R2} + R_{R1})$$

wherein:

VDC_SOURCE is a voltage of the power source;

$R_{R2}$ is the resistance of the first resistor; and $R_{R1}$ is a resistance of a third resistor that connects between the power source and the third node.

20. The method of claim 9, wherein a cathode of another Zener diode of the at least two Zener diodes is associated with the discrete input.

* * * * *